United States Patent [19]

Kunihisa et al.

[11] Patent Number: 5,461,265
[45] Date of Patent: Oct. 24, 1995

[54] HIGH-FREQUENCY VARIABLE IMPEDANCE CIRCUIT HAVING IMPROVED LINEARITY OF OPERATING CHARACTERISTICS

[75] Inventors: Taketo Kunihisa; Tadayoshi Nakatsuka, both of Osaka, Japan

[73] Assignee: Matsushita Electric Industrial Co., Ltd., Japan

[21] Appl. No.: 54,248

[22] Filed: Apr. 30, 1993

[30] Foreign Application Priority Data

May 25, 1992 [JP] Japan ...................... 4-132178

[51] Int. Cl.⁶ .................................................. H03K 17/56
[52] U.S. Cl. ............................ 307/98; 327/379; 327/419; 333/33
[58] Field of Search ............................. 307/98–100, 103, 307/490, 264, 262; 361/58; 333/32, 33, 124; 370/32.1; 379/394, 398, 340; 327/231, 240, 304, 306, 311, 334, 379, 355, 419, 372, 431, 551

[56] References Cited

U.S. PATENT DOCUMENTS

| | | | |
|---|---|---|---|
| 3,763,382 | 10/1973 | Horichi et al. ........................ | 327/306 |
| 4,647,789 | 3/1987 | Upadhyayula ......................... | 327/240 |
| 4,706,030 | 11/1987 | Willard et al. ........................ | 327/304 |
| 4,970,620 | 11/1990 | Lehnhoff et al. ..................... | 327/231 |
| 5,038,060 | 8/1991 | Francheteau et al. ................. | 327/231 |
| 5,039,891 | 8/1991 | Wen et al. ............................. | 327/333 |

FOREIGN PATENT DOCUMENTS

| | | |
|---|---|---|
| 2-246606 | 2/1990 | Japan . |
| 3-29406 | 7/1991 | Japan . |

*Primary Examiner*—William M. Shoop, Jr.
*Assistant Examiner*—Richard T. Elms
*Attorney, Agent, or Firm*—Parkhurst, Wendel & Rossi

[57] ABSTRACT

A variable impedance element suitable for controlling a high-frequency signal is formed of a pair of FETs of identical conduction type, and functions to prevent variations in degree of channel opening of the FETs in response to positive and negative-going changes of the controlled signal voltage, to thereby achieve high linearity of impedance characteristics. Each FET has the drain and gate electrodes mutually coupled by a capacitor, the source electrodes of the FETs are mutually coupled, the gate electrodes are mutually isolated with respect to the high-frequency signal and coupled in common to receive an impedance control voltage, and the variable impedance appears between the drain electrodes.

4 Claims, 9 Drawing Sheets

FIG. 10

# HIGH-FREQUENCY VARIABLE IMPEDANCE CIRCUIT HAVING IMPROVED LINEARITY OF OPERATING CHARACTERISTICS

BACKGROUND OF THE INVENTION

1. Field of the Invention

The present invention relates to a variable impedance circuit for high-frequency applications, for uses such as automatic gain control.

2. Description of the Related Art

In the prior art, PIN diodes have been used as variable impedance elements for high-frequency applications. However with a PIN diode it is necessary to pass a DC current through the diode, with the DC current level being varied to produce variations in the diode impedance.

Field effect transistors (FETs) have also been used as variable impedance elements, for example as described in Japanese Patent Application No. 3-206889. In that case, the impedance of the channel of an FET is varied by altering a DC voltage applied to the gate electrode of the FET, i.e. with the impedance between the drain electrode and source electrode of the FET being thereby varied.

The PIN diode has the disadvantage that it is necessary to pass a significant level of current through the diode, with resultant power consumption. In some applications in which power consumption must be minimized, this is a serious disadvantage. If a FET is used as a variable impedance element as described above, there is the disadvantage that the relationship between drain voltage and channel current becomes very non-linear, when the gate voltage is brought close to the channel pinch-off condition. As a result, problems such as increased intermodulation distortion and deterioration of the high-frequency input/output characteristics (i.e. an excessively high VSWR figure) will arise.

Figure 1A:
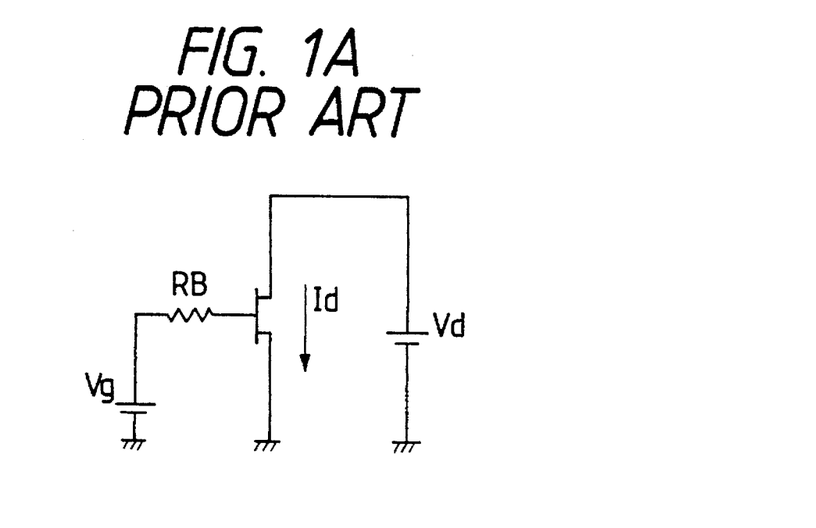
FIG. 1A is a diagram of a circuit for measuring the DC characteristics of a prior art high-frequency variable impedance element using a single FET.

These disadvantages will be made clear by examining the DC characteristics of an n-channel depletion-type GaAs MES FET, which could be used as a high-frequency variable impedance element with the source electrode connected to ground potential, an input signal voltage applied to the drain electrode, and a variable DC control voltage applied to the gate electrode to thereby vary the channel impedance. FIG. 1A shows a circuit containing such a FET, set up to measure the DC characteristics. The FET is assumed to have a threshold voltage of $-0.4$ V, an a gate width Wg of 200 µm. In FIG. 1A, the gate voltage Vg is varied as a parameter, applied through a resistor RB of value 2 kΩ (inserted to prevent any significant level of current from flowing into the channel from the gate electrode), with the resultant relationships between applied drain voltage Vd and resultant drain current Id being measured. The characteristics obtained in this way are shown in FIG. 1B.

Figure 1B:
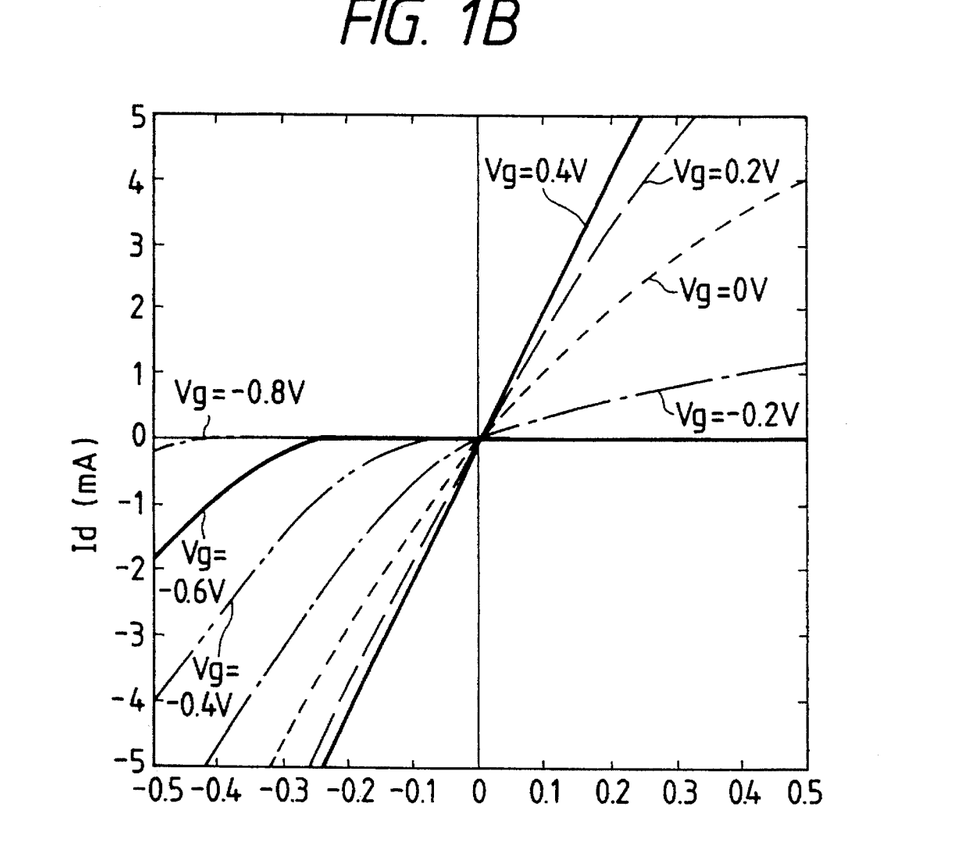
FIG. 1B shows the results of measurements obtained by the circuit of FIG. 1A, illustrating non-linearity of Vd/Id characteristics.

As shown in FIG. 1B, there is a substantial deterioration of linearity of the Vd/Id characteristics when the gate voltage Vg is approximately $-0.4$ V and the 10 drain voltage Vd is close to 0 V. This is due to the fact that when Vd is greater than 0 V, the channel of the FET is in the pinch-off condition, or is close to the pinch-off condition, whereas when Vd is less than 0 V, the channel becomes opened. Hence, there are large changes in Id when Vd is close to 0 V and the gate voltage is close to the threshold voltage.

Such a high degree of non-linearity of the Vd/Id characteristics results in a high level of intermodulation distortion and deterioration of the input/output characteristics, when such a FET is used as a high-frequency variable impedance element.

To overcome that problem of non-linearity of the characteristics when the value of Vd is close to zero, it would be possible to use a combination of a pair of complementary FETs in a variable impedance element functioning as a variable impedance element. However it is difficult to produce complementary FETs of a type which are suitable for high-frequency operation, by a practical method of manufacture, i.e. with n-type and p-type FETs being manufactured in the same process, in which mutually adjacent FETs are produced using the same mask patterns. In addition, it is difficult to form complementary FETs of a type which are suitable for such high-frequency applications and which are also closely 10 matched in electrical characteristics. Hence it is difficult to actually implement such a variable impedance element using complementary FETs.

SUMMARY OF THE INVENTION

It is an objective of the present invention to overcome the problems of the prior art set out above, by providing a high-frequency variable impedance element which does not require a significant flow of DC current, which has a high degree of linearity of electrical characteristics and so produces a low amount of distortion.

It is a further objective of the present invention to provide such a high-frequency variable impedance element by utilizing only FETs which are of identical conduction type, and which thereby overcome the above-mentioned problems which arise with complementary FETs in regard to manufacturing difficulties and problems of matching of FET characteristics.

To achieve the above objectives, the present invention provides a high-frequency variable impedance element, comprising:

a first field effect transistor, and means for mutually connecting a drain electrode and gate electrode of said first field effect transistor with respect to high frequency AC voltages while mutually isolating said drain electrode and gate electrode with respect to DC voltages;

a second field effect transistor of identical conduction type to said first field effect transistor, and means for mutually connecting a drain electrode and gate electrode of said second field effect transistor with respect to high-frequency AC voltages while mutually isolating said drain electrode and gate electrode with respect to DC voltages;

means for mutually connecting said gate electrodes of said first and second field effect transistors with respect to DC voltages while mutually isolating said gate electrodes with respect to high-frequency AC voltages; and means for mutually connecting respective source electrodes of said first and second field effect transistors with respect to high-frequency AC voltages;

wherein a first DC voltage is supplied in common to said gate electrodes while a second DC voltage is supplied in common to each of said drain electrodes, and wherein one of said first and second DC voltages is varied with respect to the other, to thereby vary a value of impedance appearing between said drain electrodes.

More specifically, such a variable impedance element preferably comprises:

a first field effect transistor, and a first capacitor connected between a drain electrode and a gate electrode of said first field effect transistor;

a second field effect transistor, of identical conduction type to said first field effect transistor, having a source electrode which is connected to a source electrode of said first field effect transistor, and a second capacitor connected between a drain electrode and a gate electrode of said second field effect transistor;

a first impedance device having one end thereof connected to said gate electrode of the first field effect transistor, and a second impedance device having one end thereof connected to said gate electrode of the second field effect transistor and a second end thereof connected at a common junction with a second end of said first impedance device;

wherein a variable DC control voltage is applied to said common junction of said first and second impedance devices while each of said drain electrodes is set at a common DC potential, and said variable DC control voltage is varied to thereby alter a value of impedance between said drain electrodes.

As a result, such a variable impedance element provides extremely high linearity, thereby reducing intermodulation distortion of a high-frequency signal whose amplitude is controlled by using the impedance element. The high degree of linearity results from the fact that the cyclic positive-going and negative-going variations of the controlled high-frequency signal do not produce respectively different degrees of opening of the channels of the FETs. Thus, the main source of intermodulation distortion which arises with prior art types of FET variable impedance elements is effectively eliminated.

DESCRIPTION OF PREFERRED EMBODIMENTS

Figure 2A:
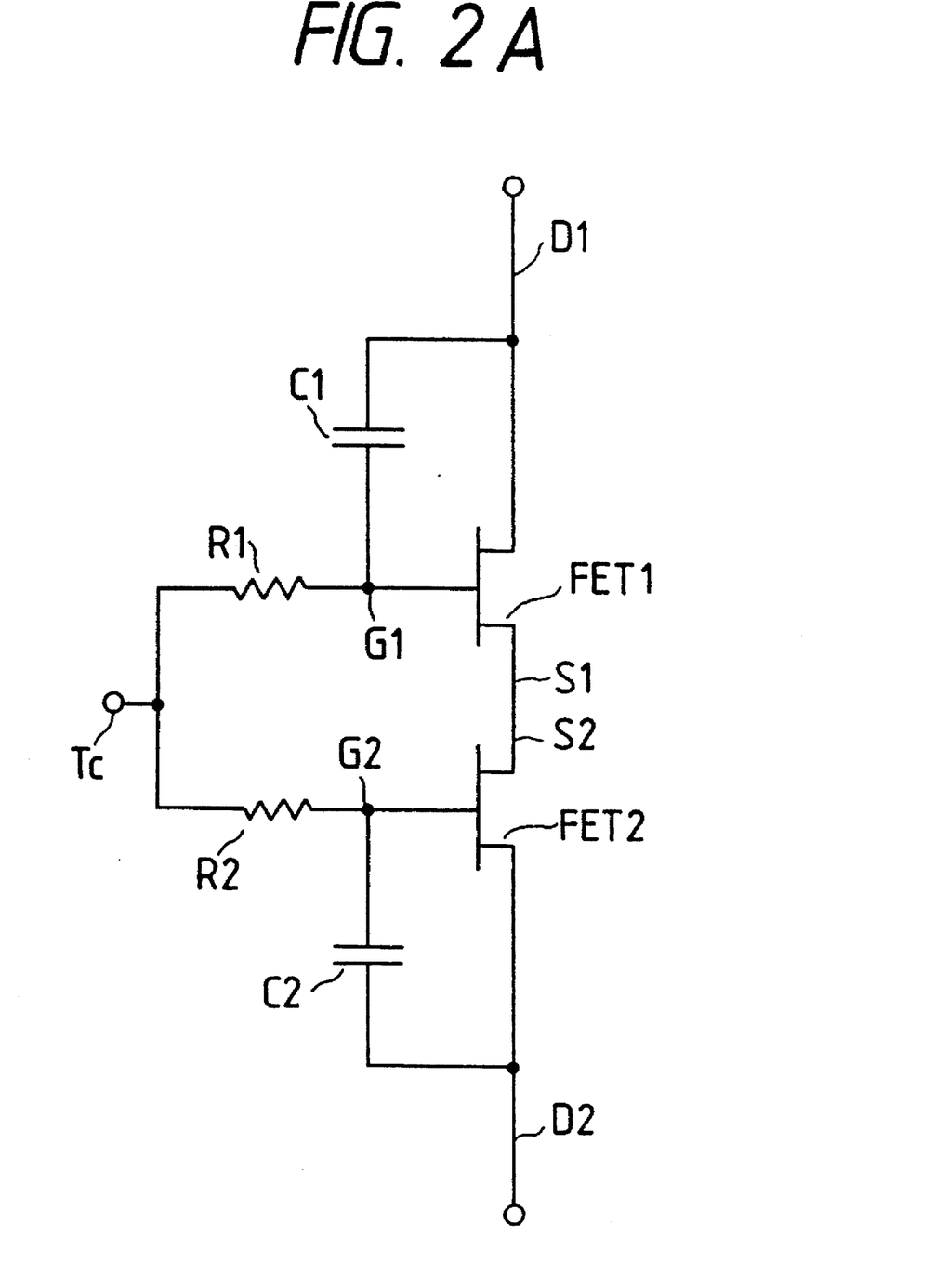
FIGS. 2(A) and 2(B) are circuit diagrams of embodiments of a high-frequency variable impedance element according to the present invention.

FIG. 2(A) is a circuit diagram of an embodiment of a circuit constituting a variable impedance element according to the present invention, in which FET 1 and FET 2 are respective n-channel depletion-mode FETs. It is to be understood that the term "element" as applied in the following description and the appended claims to "variable impedance element", signifies a combination of circuit elements having a control terminal and two other terminals between which a variable impedance appears. Respective connecting leads to the drain electrode, gate electrode and source electrode of FET 1 are designated as D1, G1 and S1, while respective connecting leads to the drain electrode, gate electrode and source electrode of FET 2 are designated as D2, G2 and S2. When used in a shunt variable-attenuation circuit, the drain electrode lead D2 is connected to ground potential with respect to to high-frequency voltages, i.e. is connected either directly or through a capacitor to ground, an input signal which is to be amplitude-controlled is applied to the drain electrode lead D1, and the impedance between D1 and D2 is controlled by varying a DC voltage which is applied to an impedance control terminal Tc. The drain electrode and gate electrode of FET 1 are mutually connected with respect to high-frequency voltages by a capacitor C1, while the gate electrode of FET 1 is isolated with respect to high-frequency voltages from the impedance control terminal Tc by an impedance element, which in this embodiment is a resistor R1. Similarly, the drain electrode and gate electrode of FET 2 are mutually connected with respect to high-frequency voltages by a capacitor C2, while the gate electrode of FET 2 is isolated with respect to high-frequency voltages from the impedance control terminal Tc by a resistor R2. It can thus be understood that the respective gate electrodes of the FET 1 and FET 2 are mutually isolated with respect to high-frequency voltages, but are mutually connected to an identical DC voltage which is applied to the impedance control terminal Tc.

The basic principles of operation of this variable impedance element are as follows. If a high-frequency signal is applied to the drain electrode line D1, then the potential of G1 will follow that of D1. On the 10 other hand, the gate electrode and source electrode of FET 2 are both connected to ground potential, with respect to high-frequency voltages, and hence will not vary in potential in response to the signal which is applied to the drain electrode line D1. Hence, when the signal voltage applied to D1 goes positive, the FET 1 will be biased such as to display a diode characteristic, whereas FET 2 will be biased such as to display a resistive characteristic. Due to the fact that FET 1 and FET 2 are connected in series, the potential of the source electrode of FET 1, i.e.

of S1, will vary such as to ensure that the respective currents which flow through the channels of FET 1 and FET 2 are mutually identical.

When the signal voltage applied to D1 goes negative, the FET 1 will be biased such as to display a resistive characteristic, whereas FET 2 will be biased such as to display a diode characteristic. Since FET 1 and FET 2 are connected in series, the potential of the source electrode of FET 1 will again vary such as to ensure that the respective currents which flow through the channels of FET 1 and FET 2 are mutually identical.

As a result, such a variable impedance element does not exhibit the large amount of non-linearity of current flow through the variable-impedance path (i.e. between D1 and D2) which occurs with the prior art single-FET variable impedance element described hereineabove in which only the impedance of the channel of a single FET is varied.

Figure 3A:
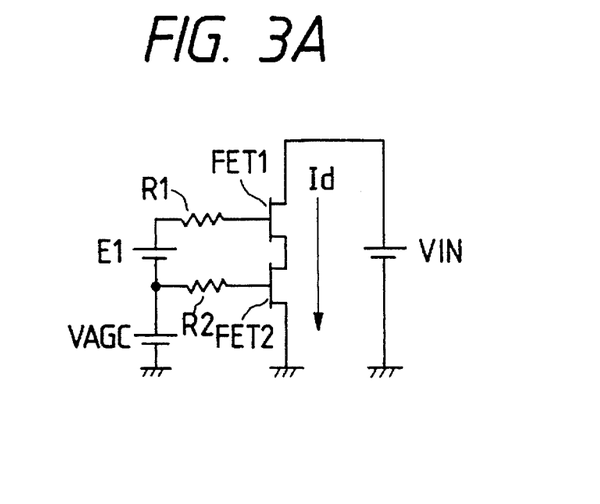
FIG. 3A is a diagram of a circuit for measuring the DC characteristics of the variable impedance element of FIG. 2.

The above points will be illustrated by the DC characteristics of the variable impedance element of FIG. 2(A), referring first to the circuit of FIG. 3A which was used to measure these characteristics. In FIG. 3A, a voltage designated as $V_{AGC}$ is applied between ground potential and the opposite end of resistor R2 from the gate electrode of FET 2, and is varied between a number of discrete values, as a parameter. Resultant changes in the drain current Id which flows through the channels of FET 1 and FET 2 are measured with respect to the voltage $V_{IN}$ applied to the drain electrode of FET 1. A DC voltage source E1 is connected between the opposite end of resistor R1 from the gate electrode of FET 1 and the point at which the voltage $V_{AGC}$ is applied to resistor R1. The voltage produced from the voltage source E1 is always made identical to the voltage $V_{IN}$ that is applied to the drain electrode of FET 1, so that the voltage applied to the gate electrode of FET 1 will always be ($V_{AGC}+V_{IN}$). In the test example, the threshold voltage of each of FET 1 and FET 2 was 0.4 V, the channel width Wg of each FET is 400 μm, and each FET is a GaAs MES FET. The resistors R1, R2 are each 2 kΩ. Capacitor C1 is omitted, since the effects that would be produced in high-frequency operation are replaced by the effects of the voltage source E1, and since the drain electrode of FET 1 is directly connected to ground potential, the capacitor C2 is also omitted.

Figure 3B:
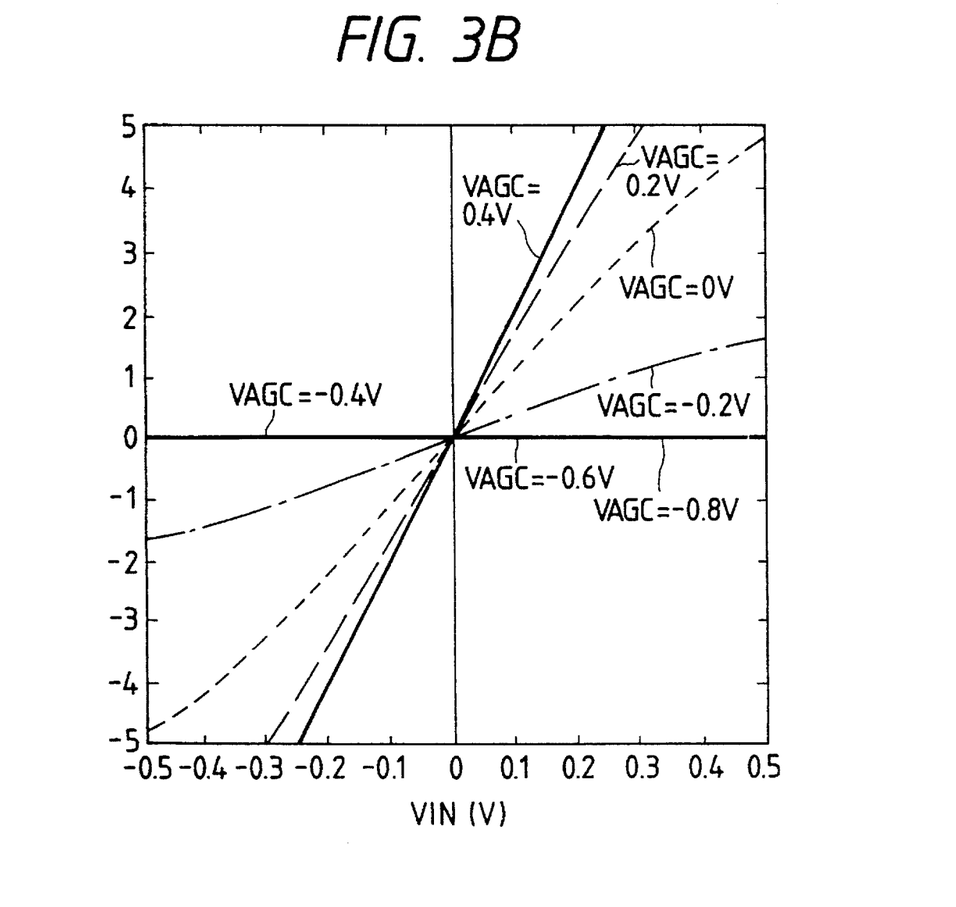
FIG. 3B shows the results of measurements obtained by the circuit of FIG. 3A, illustrating improved linearity of the Vd/Id characteristics.

The resultant measured characteristics of Vd/Id are shown in FIG. 3B, with $V_{AGC}$ varied as a parameter. As can be understood by comparing these DC characteristics with those of the prior art example of FIG. 1B, a much higher degree of linearity is maintained with the circuit of the present invention, even when the voltage $V_{IN}$ is close to zero.

Figure 4A:
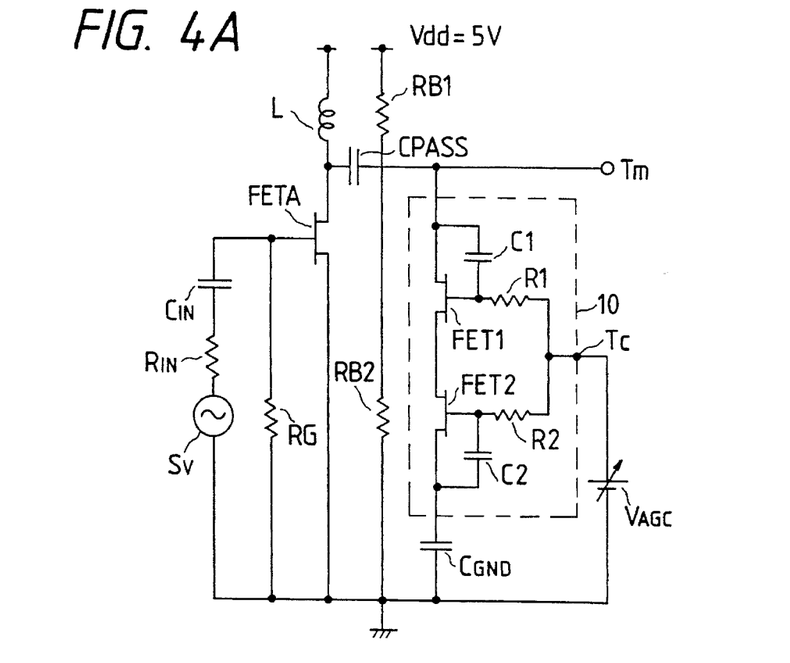
FIG. 4A is a circuit diagram of an embodiment of an automatic gain control circuit according to the present invention, incorporating the variable impedance element of FIG. 2.
Figure 4B:
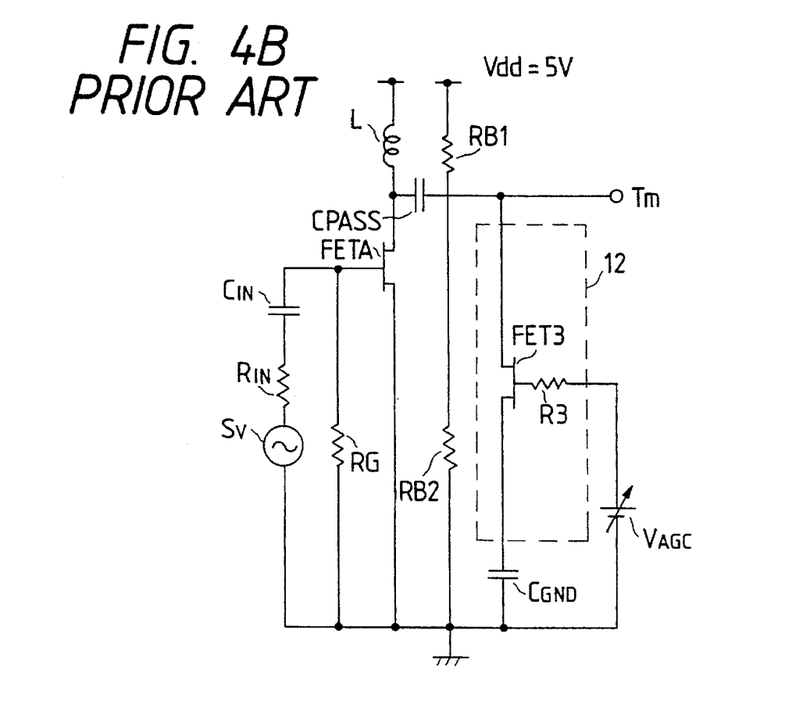
FIG. 4B is a circuit diagram of an example of an automatic gain control circuit incorporating a prior art single-FET variable impedance element.

FIG. 4A is a circuit diagram of an embodiment of an AGC circuit which incorporates a variable impedance element according to the present invention, designated by numeral 10, of the form shown in FIG. 2. FIG. 4B is a circuit diagram of an example of an AGC circuit which incorporates a single-FET type of variable impedance element, designated by numeral 12, provided for comparison with the operating characteristics obtained by the circuit of FIG. 4A. These circuits were implemented by SPICE simulation. In FIG. 4A, a high frequency signal produced from a signal source Sv having a characteristic impedance designated as Rin is transferred through a capacitor Cin to the gate electrode of FET A, whose source electrode is connected to ground potential, with the gate electrode and source electrode of FET A being shunted by a resistor RG. An inductor L is connected between the drain electrode of FET A and a positive supply voltage Vdd. The signal which appears at the drain electrode of FET A is transferred through a capacitor $C_{PASS}$ to a monitor terminal Tm, which is shunted by the aforementioned variable impedance circuit, with an AC by-pass capacitor $C_{GND}$ connected between the drain electrode of FET 2 of that variable impedance element and ground. A gain control signal designated as $V_{AGC}$, which is a variable DC signal, is applied to the control terminal Tc of the variable impedance element 10. A fixed DC bias voltage is applied, from the junction of two resistors RB 1 and RB 2 which are connected between the supply voltage Vdd and ground potential, to the drain electrode of FET 1 of the variable impedance element. The values of RB 1 and RB 2 are identical, and the value of supply voltage Vdd is +5 V, so that the fixed DC bias voltage applied to drain electrode of FET 1, and hence applied to the channels of each of FET 1 and FET 2, is +2.5 V.

The configuration of the AGC circuit of FIG. 4B differs from that of FIG. 4A only in that a prior art type of variable impedance element is used, consisting of a single FET, FET 3 which receives the control voltage $V_{AGC}$ through a resistor R3.

It can be understood from FIG. 4A that it is a basic feature of a variable impedance element according to the present invention that drain electrodes of the FETs 1 and 2 of the impedance element are set to an identical DC potential. In FIG. 4A, this is ensured by insertion of the AC by-pass capacitor $C_{GND}$, so that since the drain of the FET 2 is connected through the channels of FETs 1, 2 to the DC voltage (+2.5 V) that is applied to the drain of FET 1, the drain of FET 2 will also be at that same DC voltage.

The component values used in the circuits of FIGS. 4A, 4B are as follows. FET 1 and FET 2 are both n-channel GaAs MES FETs, having a threshold voltage of −0.4 V and a gate width Wg of 400 μm, FET 3 is an n-channel GaAs MES FET having a threshold voltage of −0.4 V, and gate width Wg of 200 μm, C1 and C2 are each 5 pF, R1, R2 and R3 are each 2 kΩ, FET A is a GaAs MES FET having a threshold voltage of −0.4 V and a gate width of 400 μm, $C_{PASS}$ is 100 pF, RB 1 and RB 2 are each 2 kΩ, RG is 2 kΩ, Cin is 100 pF, L is 1 μH, $C_{GND}$ is 100 pF, and Rin is 50 Ω In addition to providing isolation between the gate electrodes of FET 1 and FET 2 as described hereinabove, the resistors R1, R2 also serve to prevent excessive flow of current from the gate electrodes into the channels of FET 1, FET 2, and also function to suppress fluctuations in the DC bias supplied to the gate electrodes.

Figure 5:
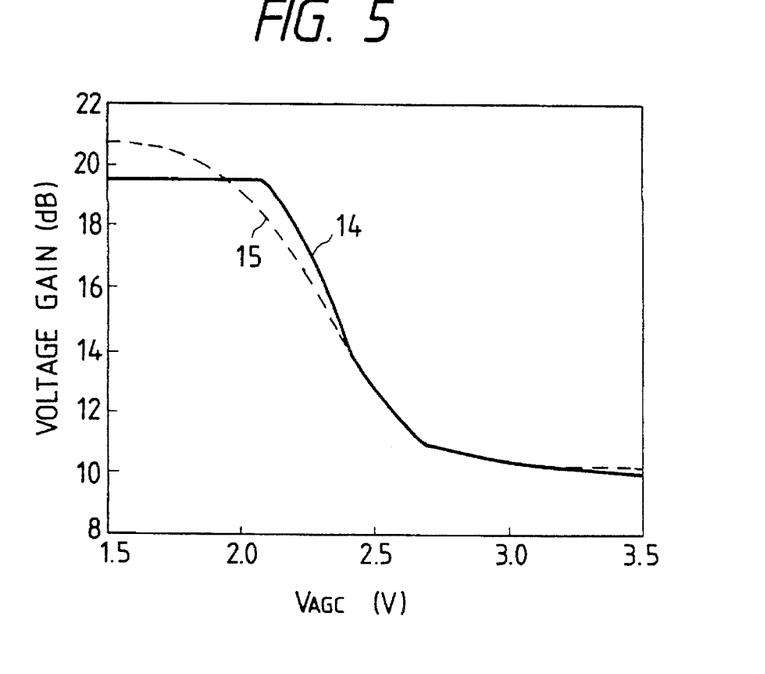
FIG. 5 shows gain control characteristics obtained by the AGC circuit of the present invention of FIG. 4A and by the prior art AGC circuit of FIG. 4B, respectively.

FIG. 5 shows the gain control characteristics obtained for the circuits of FIG. 4A, 4b respectively, with gain being measured against changes in the value of $V_{AGC}$, using an input signal power level of −20 dBm, at a signal frequency of 1400 MHz. The full-line curve 14 shows the gain characteristic obtained for the AGC circuit of the present invention shown in FIG. 4A, while the broken-line curve 15 shows the gain characteristic obtained for the prior art circuit of FIG. 4B. With the embodiment according to the present invention, as shown in FIG. 5, as the value of the control voltage $V_{AGC}$ is reduced, the gain reaches a maximum value when $V_{AGC}$ is reduced to 2.1 V, i.e. when the difference between $V_{AGC}$ and the fixed DC bias voltage (+2.5 V) applied to the drain electrode of fit1 reaches the threshold voltage (−0.4 V) of FET 1 and FET 1. As $V_{AGC}$ is further reduced, so that the difference between $V_{AGC}$ and the fixed DC bias voltage becomes increasingly negative, the gain remains constant.

With the prior art circuit of FIG. 4B on the other hand, as shown by the broken-line curve in FIG. 5, even when $V_{AGC}$ is reduced below 2.1 V, gain continues to gradually increase. That is to say, even when the voltage applied to the gate of FET 3 with respect to the channel of that FET is made more negative than the threshold voltage, the channel is not held in the pinch-off condition. This is due to the fact that the channel is repetitively opened in successive short instants, i.e. once in each period of the signal which is being applied to the drain electrode of FET 3. Using the variable impedance element of the present invention however, that phenomenon is effectively suppressed, with complete channel pinch-off being achieved when the value of $V_{AGC}$ reaches a value of 2.1 V or less.

Figure 6:
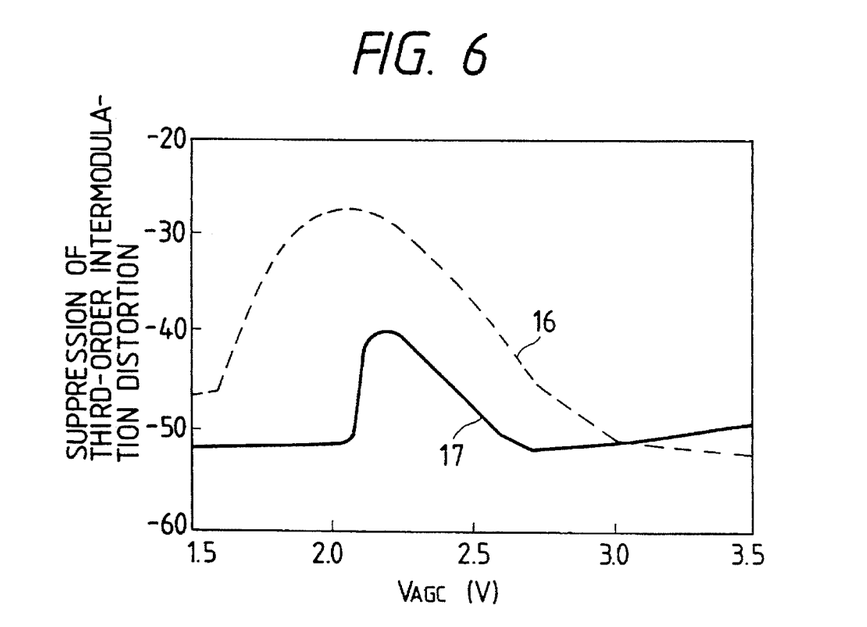
FIG. 6 shows third-order intermodulation characteristics for the AGC circuit according to the present invention of FIG. 4A and for the prior art AGC circuit of FIG. 4B, respectively.

FIG. 6 shows third-order intermodulation suppression characteristics which were obtained for the circuits of FIG. 4A (shown by the full-line curve 17) and FIG. 4B (shown by the broken-line curve 16) respectively. These characteristics were measured with respect to changes in $V_{AGC}$, using an input signal power level of −20 dBm, and signal frequencies of 1350 MHz and 1400 MHz. More specifically, the characteristics are obtained from measurements made at the monitor terminal Tm of the ratio between output signal power at 1400 MHz and output signal power at 1450 MHz. As is clear from FIG. 6, the circuit of the present invention provides a substantial improvement with respect to of third-order intermodulation suppression, by comparison with the prior art circuit of FIG. 4B.

Figure 7:
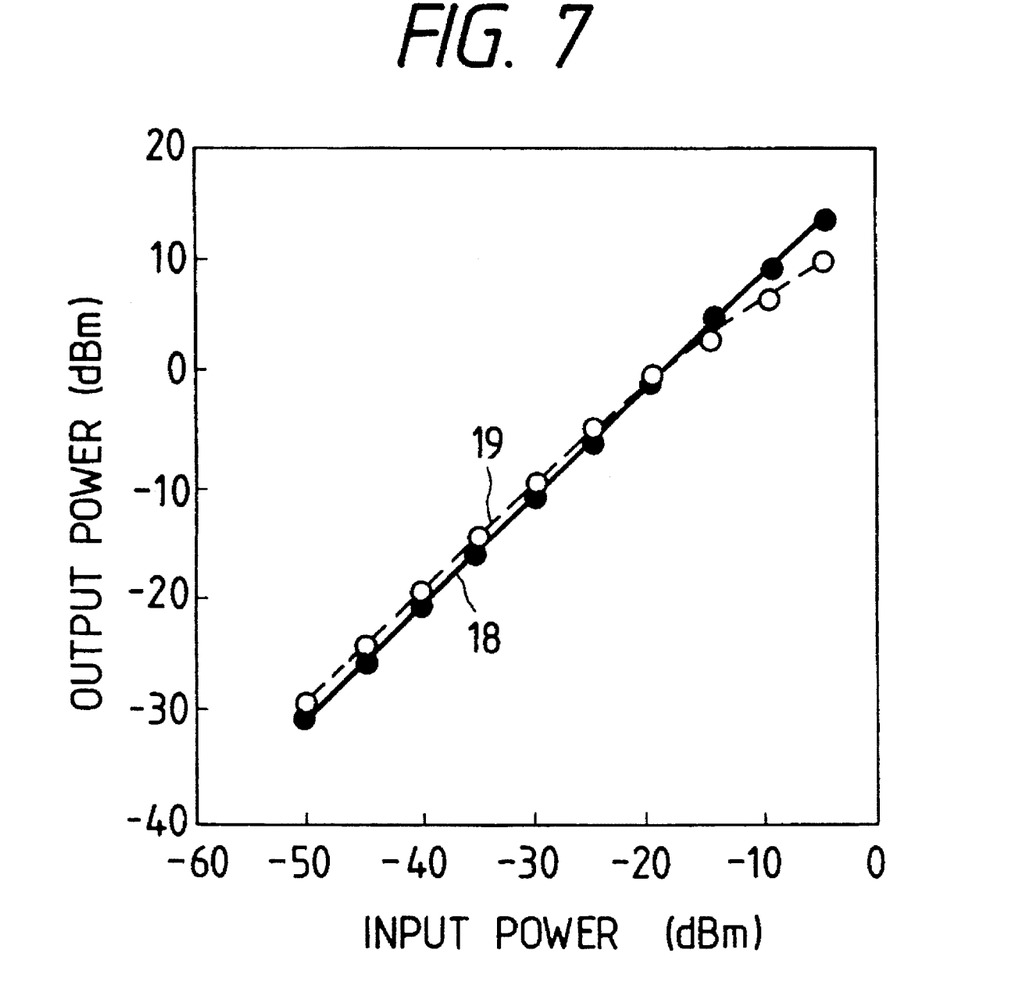
FIG. 7 shows input/output power characteristics for the AGC circuit according to the present invention of FIG. 4A and for the prior art AGC circuit of FIG. 4B, respectively.

FIG. 7 shows characteristics of input signal power versus output signal power, for the circuit of the present invention of FIG. 4A (shown by the full-line curve 18) and the prior art circuit of FIG. 4A (shown by the broken-line curve 19). These characteristics were obtained using a signal frequency of 1400 MHz, and with $V_{AGC}$ fixed at 2.1 V, i.e. with the gate bias voltage applied to the FETs 1 and 2 set at the threshold level. The characteristics show that the AGC circuit of FIG. 4A, utilizing a variable impedance element according to the present invention, provides substantially greater linearity than does the circuit of FIG. 4B which utilizes a prior art single-FET variable impedance element. As described above, with the prior art circuit of FIG. 4A, the channel of the FET 3 is opened to some degree during alternate half-cycles of the high-frequency signal appearing at the monitor terminal Tm, as that signal voltage alters the voltage difference between the gate and channel of FET 3. The degree of channel opening increases in accordance with increasing amplitude of the high-frequency signal, resulting in the non-linearity displayed by the characteristic 19 in FIG. 7. However with the circuit according to the present invention, that phenomenon is effectively suppressed.

It can be understood that the values of the gate bias resistors R1, R2 must be selected to be sufficiently high as ensure that even if DC bias current flow into the channel of FET 1 or FET 2 from the gate occurs, a sufficient voltage drop will occur in the resistors R1, R2 to ensure that the channel potential, i.e. the DC voltage (2.5 V) applied from the junction of RB1, RB2 will not be significantly altered. If insulated-gate FETs are used, of course, there is no problem.

It should be noted that the objectives of the present invention are concerned only with obtaining the improvements described hereinabove, which are based on improved linearity of the operating characteristics of the variable impedance element, and that the scope of the invention is not intended to extend to eliminating the effects which can be produced by stray capacitances, etc., in a high-frequency circuit.

It should also be noted that although the above embodiments have been described for the case of a variable impedance element utilizing control elements referred to as field effect transistors (FETs) having electrodes referred to as gate, drain and source electrodes, the scope of the invention extends to the use other types of circuit element having a configuration whereby conduction through a channel is controlled.

It should further be noted that the scope of the invention is not limited to the use of FETs which are of the types described as used in the above embodiments, or to FETs having the values of threshold voltage or gate width Wg specified for these embodiments, and that other types of FETs having other specifications could be utilized.

Figure 8A:
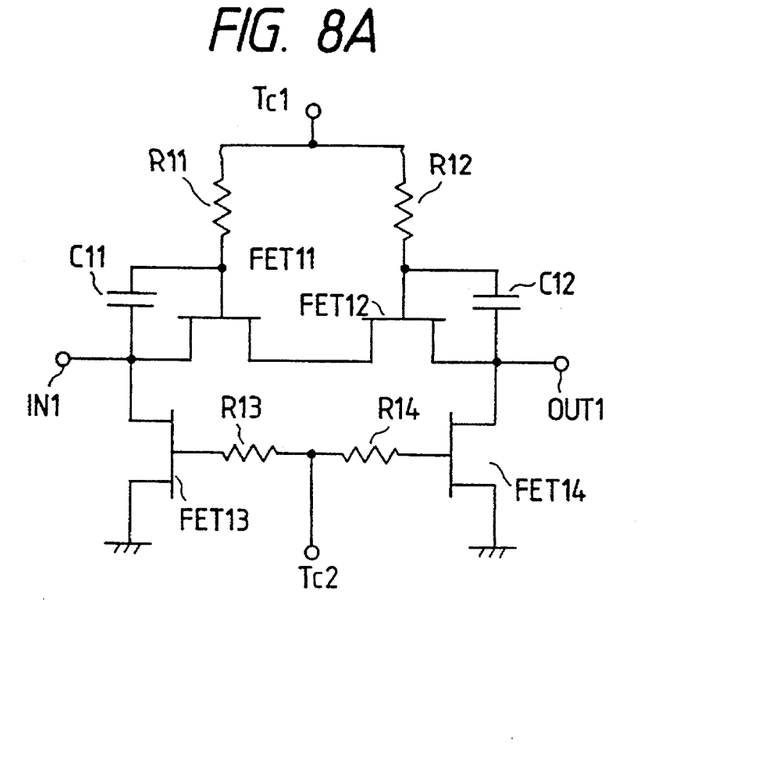
FIG. 8A is a circuit diagram of an embodiment of a configuration variable attenuator circuit, incorporating the variable impedance element of FIG. 2.

It should also be noted that various modifications to the circuit of FIG. 8A could be envisaged. The necessary DC bias conditions for the variable impedance element are that:

(a) Both of the channels of FET 1 and FET 2 are set at the same DC potential, and (b) The common DC potential of the gate electrodes of FET 1, FET 2 varies with respect to the DC potential of the channels, to vary the impedance appearing between the drain electrodes of FET 1, FET 2.

Thus, instead of holding the channel DC bias potential fixed and varying the common DC bias potential to control the impedance, as in the embodiment of FIG. 4A, it would be equally possible to fix the common gate potential of FET 1 and FET 2, i.e. replace the variable voltage $V_{AGC}$ by a fixed voltage (e.g. 2.5 V), and vary the DC bias applied to the drain electrode of FET 1 to thereby vary the impedance appearing between the drain electrodes of FET 1, FET 2. It will be apparent that the operation of the variable impedance element in that case will be unchanged from that of the circuit of FIG. 4A.

Moreover, although with the embodiment of FIG. 4A the DC bias potential of the channels (2.5 V) is applied to the drain electrode of FET 1, it would be equally possible to instead apply that channel DC bias voltage to the common connection of the source electrodes of FET 1, FET 2, or to the drain electrode of FET 2.

Figure 8B:
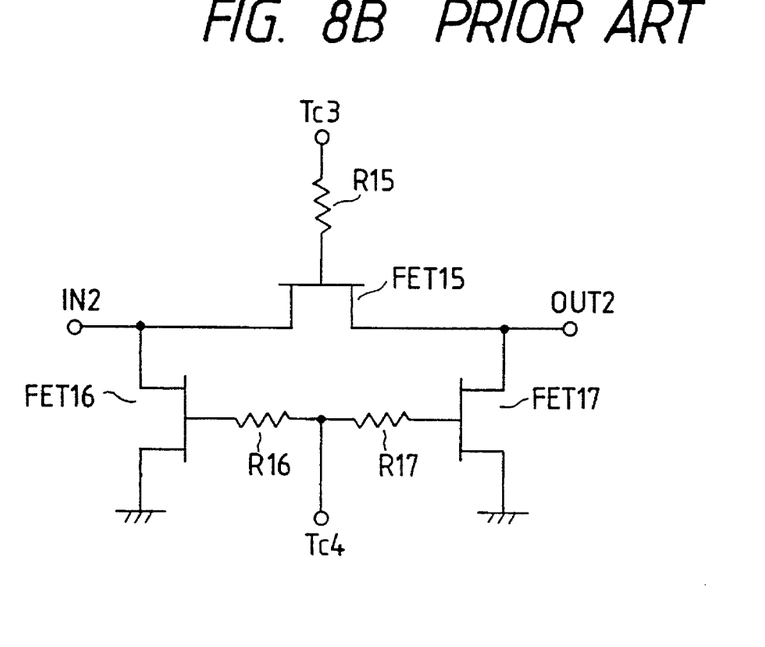
FIG. 8B is a circuit diagram of an example of a configuration variable attenuator circuit, incorporating a prior art single-FET variable impedance element.

An embodiment of a π-configuration variable high-frequency attenuator incorporating the variable impedance element according to the present invention of FIG. 2 (used as a series element) will now be described, referring to the circuit diagram of FIG. 8a. For comparison with that circuit, a π-configuration variable high-frequency attenuator incorporating the aforementioned prior-art single-FET variable impedance element as a series element is shown in FIG. 8B. Each of the circuits 8A and 8B was actually constructed, using discrete circuit components, to obtain the measurement results described hereinafter. The circuit of FIG. 8A is formed of the variable impedance element according to the present invention, connected in series between an input terminal IN1 to which an input high-frequency signal is applied and an output terminal from which the attenuated output high-frequency is obtained, a shunt variable impedance element formed of a FET 13 and resistor R13 connected between the input terminal IN1 and ground potential, and a a shunt variable impedance element formed of a FET 14 and resistor R14, which connected between the output terminal IN1 and ground potential. In FIG. 8A, the capacitors C11, C12, resistors R11, R12, and the transistors FET11, FET12, respectively correspond to C1, C2, R1, R2 and FET 1, FET 2 in the variable impedance element embodiment of FIG. 2. An impedance control voltage V1 for that variable impedance element, i.e. for controlling the series element impedance of the attenuator circuit, is applied to the control terminal Tc1 while an impedance control voltage V2 for controlling the shunt element impedances is applied to a control terminal Tc2 which is connected in common through the resistors R13, R14 to the gate electrodes of FET13, FET14 respectively. The attenuation produced between the IN1 and OUT1 terminals of the attenuator of FIG. 8A is determined as a combination of the impedances of the series and shunt impedance elements, and is varied as required by suitably combining respective variations of the control voltages V1 and V2. Similarly with the circuit of FIG. 8A, the attenuation produced between the terminals IN2 and OUT2 is varied as required by appropriate combined variations of an impedance control voltage V3 which controls the series-element impedance (of FET 15) and an impedance control voltage V4 which controls the shunt element impedances (of each of FET 16 and FET 17).

With this embodiment of FIG. 8A, as for the embodiment of FIG. 4A, the respective drain electrodes of FET 11 and FET 12 of the variable impedance element of the present invention are each set to a common DC potential. In FIG. 8A that common DC potential is ground potential, connected to the drains of FET 11, FET 12 through the channels of FETs 13, 14 respectively.

In FIG. 8A, each of FET 11 and FET 12 is a GaAs MES FET having a threshold voltage of −1.0 V and a gate width Wg of 800 μm. Each of FET 13 and FET 14 is a GaAs MES FET having a threshold voltage of −1.0 V and a gate width Wg of 400 μm. C11, C12 are each 100 pF, R11, R12, R13, R14 are each 3.3 kΩ. In FIG. 8B, each of FET 11 and FET 12 is a GaAs MES FET having a threshold voltage of −1.0 V and a gate width Wg of 400 μm, and R15, R16, R17 are each 3.3 kΩ.

Figure 9:
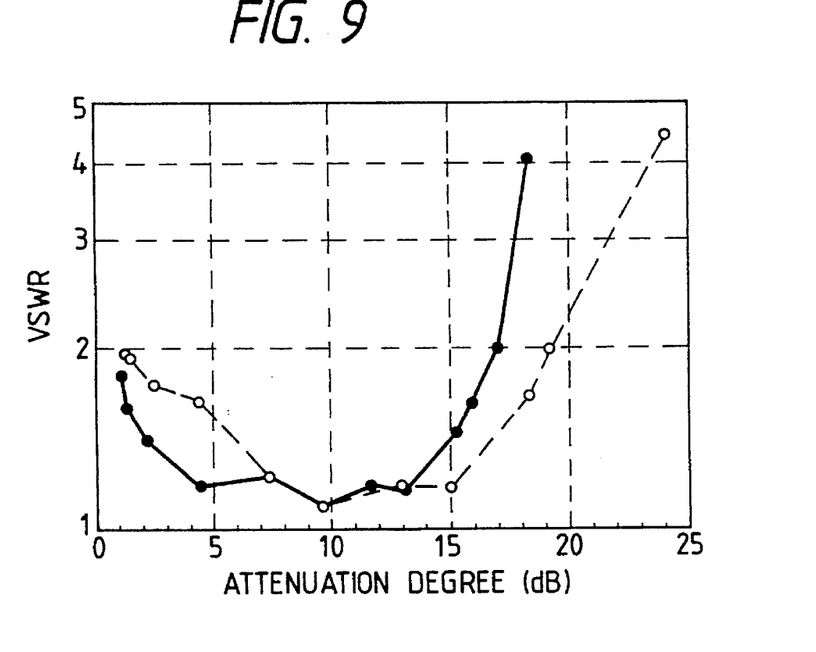
FIG. 9 shows relationships between values of attenuation and VSWR, for the circuits of FIGS. 8A and 8B respectively.

In FIG. 9 the full-line curve shows the relationship between values of attenuation and VSWR obtained for the attenuator circuit of the present invention of FIG. 8A, using the component values set out above, while the broken-line curve shows the corresponding relationship for the prior art circuit of FIG. 8b. In obtaining the measurement values for FIG. 9, a signal source having a characteristic impedance of 50Ω and a signal frequency of 1900 MHz were utilized. As can be understood from FIG. 9, both the attenuator of the present invention and the prior art attenuator provide a usable attenuation range of at least 15 dB, i.e. a range within which the VSWR figure is lower than 2. Thus, satisfactory attenuation adjustment is possible with both of these circuits.

Figure 10:
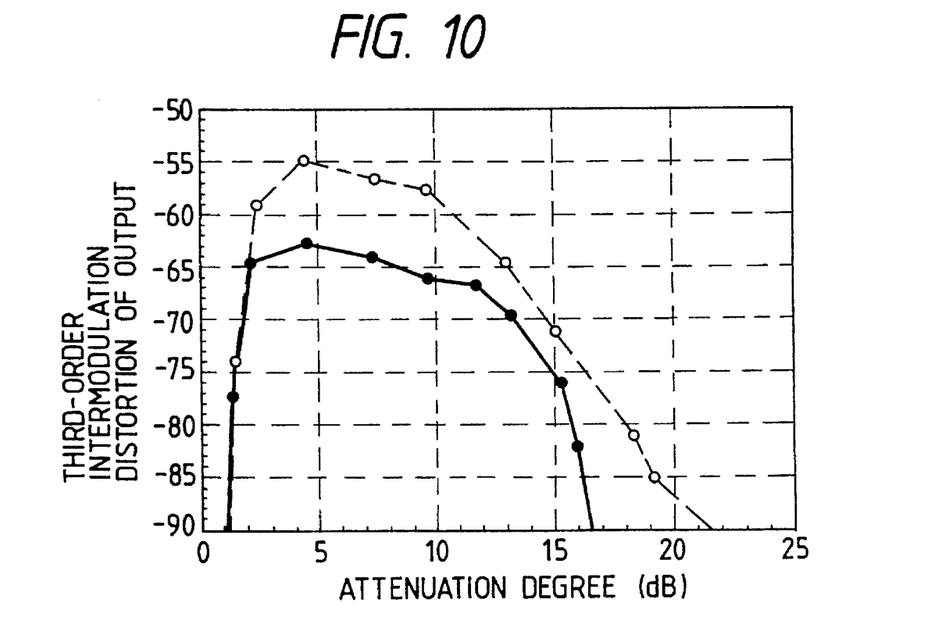
FIG. 10 shows relationships between values of attenuation and third-order intermodulation distortion, for the circuits of FIGS. 8A and 8B respectively.

In FIG. 10 the full-line curve shows the relationship between values of attenuation and levels of third-order intermodulation distortion in the output signal from the attenuator, obtained for the attenuator circuit of the present invention of FIG. 8A, using the component values set out above. The broken-line curve in FIG. 10 shows the corresponding relationship for the prior art circuit of FIG. 8B. In obtaining the measurement values for FIG. 10, an input signal power level of −15 dBm was utilized, and measurements were performed using a signal frequency of 1900 MHz and a signal frequency of 1900.3 MHz, respectively. As can be understood from FIG. 10, the attenuator circuit of the present invention shown in FIG. 8A provides a substantial improvement with regard to suppression of third-order intermodulation distortion throughout the usable range of variation of attenuation, by comparison with the prior art circuit of FIG. 8B.

In the attenuator circuit of FIG. 8A described above, the variable impedance element of the present invention is used only as the series impedance element of the attenuator circuit. However it would be equally possible to also use such variable impedance circuits for each of the shunt impedance elements, in addition to the series impedance element. Alternatively, it would be possible to use a prior art single-FET variable impedance element as the series impedance element of the attenuator circuit, and to use two variable impedance elements according to the present invention as the respective shunt impedance elements. Whichever of these arrangements is utilized, it can be understood that a significant improvement in performance can be achieved, as a result of the improved linearity of operation of the variable impedance element according to the present invention.

As can be understood from the above embodiments, a variable impedance element according to the present invention has the advantages of not requiring that a significant level of DC current be supplied in order to achieve control of impedance, and of providing a high degree of linearity of the relationship between the voltage of a controlled high-frequency AC signal and resultant current flow through the circuit. As a result, use of such a variable impedance element in a variable attenuator circuit enables substantial improvements to be achieved, with regard to reduction of intermodulation distortion and widened dynamic range.

Furthermore, since a variable impedance element according to the present invention utilizes FETs which are of a single conduction type, the manufacturing process for such a circuit can be simple and production costs can be low, by comparison with circuits which require the use of both n-channel and p-channel types of device.

It should be noted that when the variable impedance element shown in FIG. 2(A) is used in an application (such as the circuit of FIG. 4A) in which the drain D2 of FET 2 is connected to ground potential, with respect to high-frequency signals, there will be an inherently high degree of isolation between the gate G2 and source S2 of FET 2. Hence in such a case it may be possible to omit the capacitor C2.

Figure 2B:
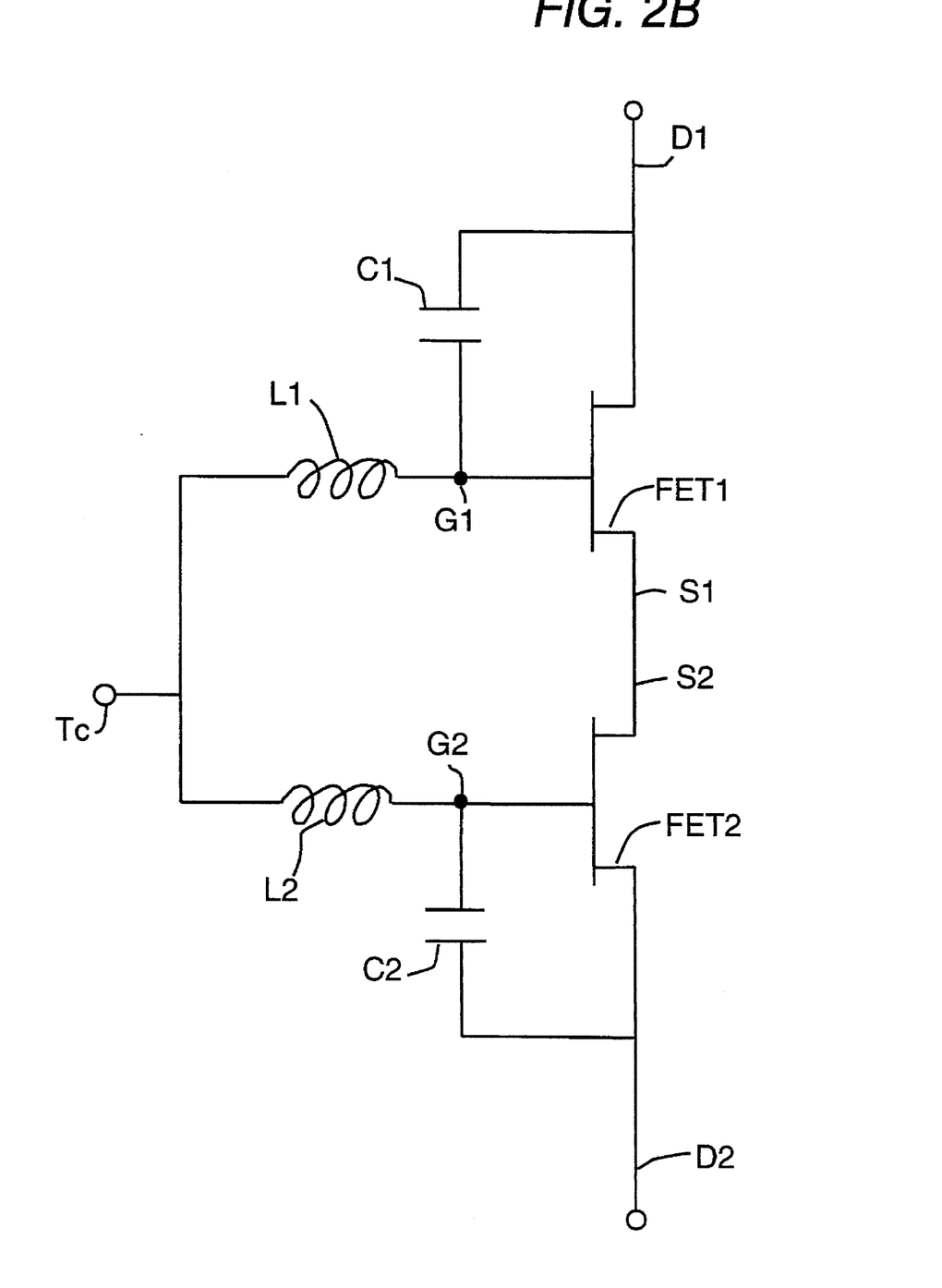

Furthermore, if FET 1 and FET 2 are insulated-gate FETs, such as MOS FETs, so that there is no possibility of current flow from the gate into the channel of an FET, then it becomes possible to omit one of the resistors R1, R2. Alternatively, in such a case it is possible to replace the resistors R1, R2 by inductors as shown in FIG. 2(B).

It can be understood from the above description that a variable impedance element according to the present invention provides the important advantages of minimal power consumption, since no significant flow of DC current is required by the element, while in addition providing a high degree of linearity, ensuring reduced intermodulation distortion of a gain-controlled high-frequency signal, and enabling an AGC circuit to be implemented having a wide dynamic range. Furthermore since only FETs of a single conduction type are utilized, the number of manufacturing steps required is small and the manufacturing cost can be low.

What is claimed is:

1. A high-frequency variable impedance element, comprising:

a first field effect transistor, and means for mutually connecting a drain electrode and gate electrode of said first field effect transistor with respect to high frequency AC voltages while mutually isolating said drain electrode and gate electrode with respect to DC voltages;

a second field effect transistor of identical conduction type to said first field effect transistor, and means for mutually connecting a drain electrode and gate electrode of said second field effect transistor with respect to high-frequency AC voltages while mutually isolating said drain electrode and gate electrode with respect to DC voltages;

means for mutually isolating said gate electrodes with respect to high-frequency AC voltages; and means for mutually connecting respective source electrodes of said first and second field effect transistors with respect to high-frequency AC voltages;

wherein a first DC voltage is supplied in common to said gate electrodes while a second DC voltage is supplied in common to each of said drain electrodes, and wherein one of said first and second DC voltages is varied with respect to the other, to thereby vary a value of impedance appearing between said drain electrodes.

2. A high-frequency variable impedance element, comprising:

a first field effect transistor, and a first capacitor connected between a drain electrode and a gate electrode of said first field effect transistor;

a second field effect transistor, of identical conduction type to said first field effect transistor, having a source electrode which is connected to a source electrode of said first field effect transistor, and a second capacitor connected between a drain electrode and a gate electrode of said second field effect transistor;

a first impedance device having one end thereof connected to said gate electrode of the first field effect transistor, and a second impedance device having one end thereof connected to said gate electrode of the second field effect transistor and a second end thereof connected at a common junction with a second end of said first impedance device;

wherein a variable DC control voltage is supplied to said common junction of said first and second impedance devices while a fixed DC voltage is supplied to at least one of said drain and source electrodes of said first and second field effect transistors, and said variable DC control voltage is varied to thereby alter a value of impedance between said drain electrodes.

3. A variable impedance element according to claim 2, wherein said impedance devices comprise respective resistors.

4. A variable impedance element according to claim 2, wherein said impedance devices comprise respective inductors.

* * * * *